United States Patent
Rozenblit et al.

(10) Patent No.: US 6,360,087 B1
(45) Date of Patent: Mar. 19, 2002

(54) DIRECT CONVERSION RECEIVER

(75) Inventors: Dmitriy Rozenblit, Irvine; William J. Domino, Yorba Linda; Morten Damgaard, Laguna Hills; Mark Oskowsky, Santa Clara, all of CA (US)

(73) Assignee: Conexant Systems, Inc, Newport Beach, CA (US)

( * ) Notice: Subject to any disclaimer, the term of this patent is extended or adjusted under 35 U.S.C. 154(b) by 0 days.

(21) Appl. No.: 09/260,919

(22) Filed: Mar. 2, 1999

(51) Int. Cl.$^7$ ................................. H04B 1/06

(52) U.S. Cl. ................ 455/255; 455/147; 331/2

(58) Field of Search ..................... 455/130, 147, 455/148, 255, 264, 265, 293, 307, 309, 313, 315, 326, 110, 317, 310, 314, 318, 324, 319; 375/316, 329, 334; 331/335, 2, 42, 43

(56) References Cited

U.S. PATENT DOCUMENTS

| | | | | |
|---|---|---|---|---|
| 5,003,621 A | * | 3/1991 | Gailus | 455/209 |
| 5,606,736 A | * | 2/1997 | Hasler et al. | 455/314 |
| 5,774,502 A | * | 6/1998 | Belcher et al. | 375/283 |
| 5,832,375 A | * | 11/1998 | Leisten et al. | 455/314 |
| 6,018,553 A | * | 1/2000 | Sanielevici et al. | 375/334 |
| 6,029,052 A | * | 2/2000 | Isberg et al. | 455/131 |
| 6,040,738 A | * | 3/2000 | Uchida | 329/302 |
| 6,073,000 A | * | 6/2000 | Shinohara | 455/310 |

FOREIGN PATENT DOCUMENTS

| EP | 0 798 880 A | 10/1997 |
|---|---|---|
| WO | 92 01337 A | 1/1992 |

OTHER PUBLICATIONS

Ian Doyle, "A Simplified Subharmonic I/Q Modulator", *Applied Microwave & Wireless*, Oct. 1998.

Takafumi Yamaji et al., "An I/Q Active Balanced harmonic Mixer with IM2 Cancelers and a 45° Phase Shifter", *IEEE Journal of Solid–State Circuits*, vol. 33, No. 12, Dec. 1998.

\* cited by examiner

*Primary Examiner*—William Trost
*Assistant Examiner*—Congvan Tran
(74) *Attorney, Agent, or Firm*—Howrey Simon Arnold & White

(57) ABSTRACT

A direct conversion receiver system is provided in which a first input signal at a first frequency is applied to a first input port of a multiplier, a second input signal at a second frequency equal to about $1/n$ times the first frequency, wherein n is an integer, is applied to a second input port of the multiplier. A first filter coupled to the first input port is configured to substantially filter out any leakage at the second frequency which may be present. A second filter coupled to the second input port is configured to substantially filter out any leakage at the first frequency which may be present. The multiplier is configured to produce a signal at an output port thereof which is derived from the product of the first and second signals. In one embodiment, the output is representative of the product of the filtered first signal and a multiplication factor which switches at n times the second frequency. The output of the multiplier is coupled to a third filter. The output signal has a baseband component and another component. The third filter is configured to substantially filter out the other component and substantially maintain the baseband component in the output signal. In one implementation example, the multiplier is a mixer initializing half-frequency injection, such that the LO frequency is about ½ the RF frequency.

41 Claims, 13 Drawing Sheets

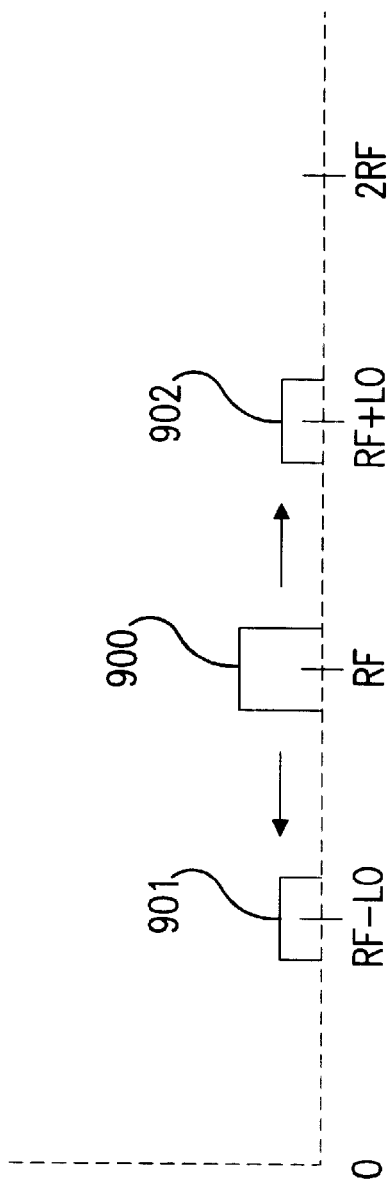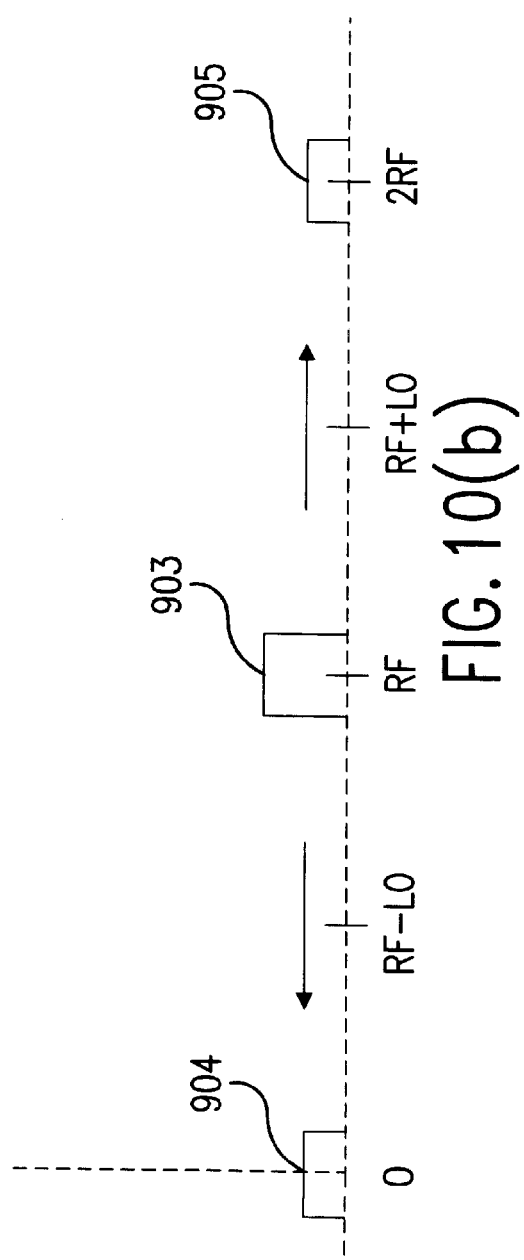

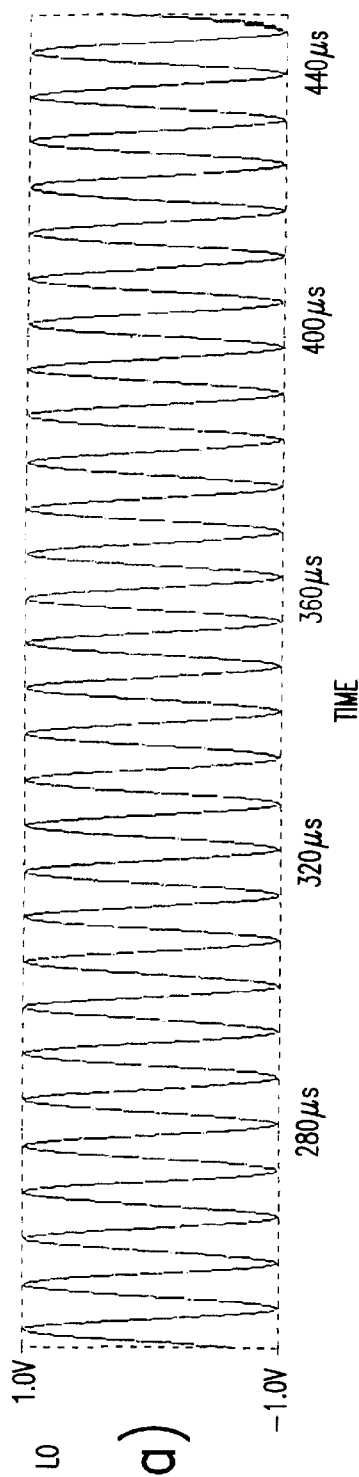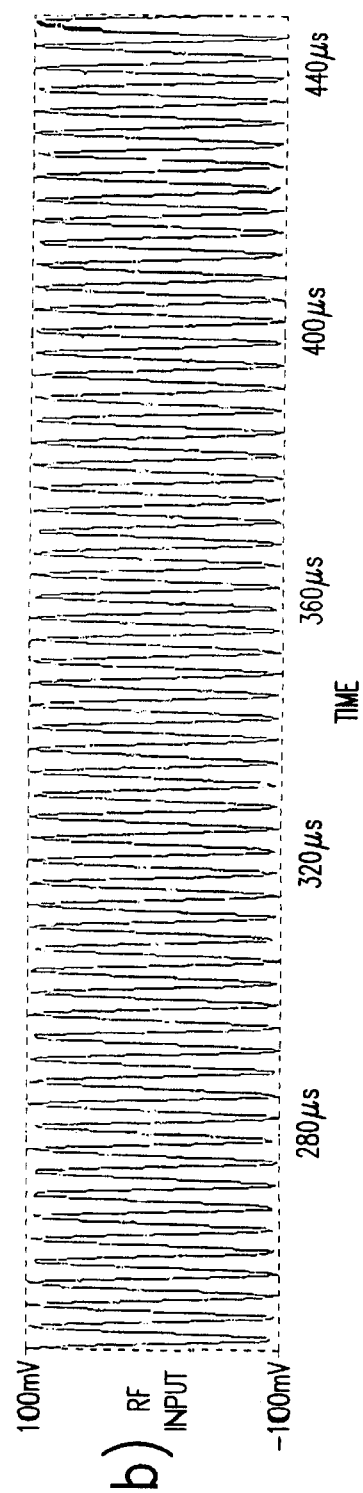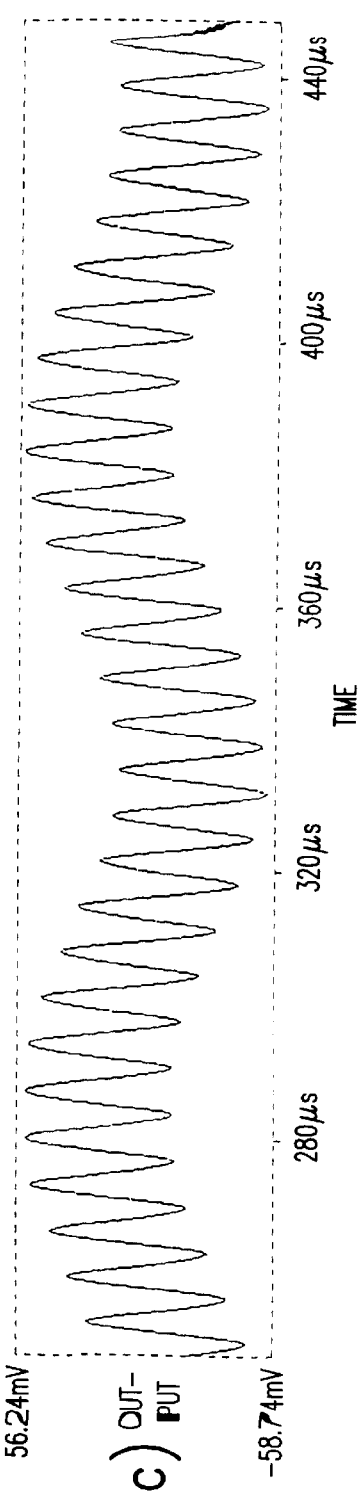

DIRECT CONVERSION RECEIVER

BACKGROUND OF THE INVENTION

1. Field of the Invention

This invention relates generally to direct conversion receivers, and more specifically, to direct conversion receivers employing a mixer configured to reduce the effects of leakage between the radio frequency and local oscillator input ports thereof.

2. Background

A radio receiver of the type currently employed in mobile wireless phones is illustrated in FIG. 1. As shown, the receiver comprises a first mixer 1, having a radio frequency (RF) input port 5 coupled to an antenna 11, and a local oscillator (LO) input port 8. The mixer has an output port 12 coupled, through signal line 6, to the input of a band-pass filter (BPF) 3. The BPF 3 has an output coupled to the intermediate frequency (IF) input port 10 of a second mixer 2. The second mixer 2 also has a local oscillator (LO) input port 9. The output port 14 of mixer 2 is coupled, through signal line 15, to the input of low-pass filter (LPF) 4. The output of LPF 4 is coupled to signal line 7.

First mixer 1 is configured to multiply the signals received at the RF and LO input ports thereof, and provide the multiplied signal at the output port thereof. The frequency of the signal received at the RF input port is $f_{RF}$, and the frequency of the signal received at the LO input port is $f_{LO1}$. The signal received at the RF input port is derived from a signal received over antenna 11. Typically, this signal represents a digitized audio signal which has been modulated onto an RF carrier signal. In the following discussion, this digitized audio signal will be referred to as the baseband signal, but it should be appreciated that, in practice, the baseband signal can be a desired signal other than a digitized audio signal, including a data signal.

The signal provided at the output port 12 will have first order components at frequencies $f_{RF}-f_{LO1}$ and $f_{RF}+f_{LO1}$. The frequency $f_{RF}-f_{LO1}$ is an intermediate frequency which will be referred to as $f_{IF}$. In one implementation, $f_{RF}$ is 900 MHz, $f_{LO1}$ is 450 MHz, and $f_{IF}$ is 450 MHz. In this implementation, the first order components of the output signal will be at 1350 MHz and 450 MHz.

BPF 3 has a passband centered at $f_{IF}$, and is configured to allow passage of the IF component of the output signal, and to prevent passage of the other first order component, that is, the component at the frequency $f_{RF}+f_{LO1}$. BPF 3 also rejects any unwanted signals outside the desired band around $f_{RF}-f_{LO1}$. This IF component is then provided as an input to input port 10 of mixer 2.

The signal provided as an input to the LO port of mixer 2 has a frequency $f_{LO2}$. This frequency is selected so that it is the same as the frequency $f_{IF}$ of the signal provided at the input port 10. Mixer 2 multiplies these two signals, and provides the multiplied signal on output port 14. The output signal will have two first order components, one at the baseband frequency, $f_{BB}$, and the other at twice the intermediate frequency $f_{IF}$.

The output signal from mixer 2 is provided as an input to LPF 4. LPF 4 is configured to allow passage of the baseband component of the signal output from mixer 2, and prevent passage of the high frequency component, that is, the frequency at twice $f_{IF}$, of the output of mixer 2. The baseband component is thus provided as an output of the receiver line 7.

In operation, the receiver of FIG. 1 functions as follows. A signal is received over antenna 11 representing a baseband signal modulated onto an RF carrier signal. The signal is passed through mixer 1, which produces at its output port a signal having a first order component representative of the baseband signal, but at an intermediate frequency rather than baseband frequencies, and also a second first order component. The signal is passed through BPF 2 to isolate the intermediate frequency component from the other first order component. This intermediate frequency component is then passed through mixer 2, which produces at its output port a signal having a baseband component and an intermediate frequency component. The signal is then passed through LPF 4 to isolate the baseband component from the higher frequency component. LPF 4 thus produces at its output a signal representative of the baseband signal.

As is apparent from the foregoing description, the operation of the receiver of FIG. 1 proceeds in two basic steps. In the first step, the baseband portion of the incoming RF signal is down converted to an intermediate frequency. In the second step, the baseband portion at the intermediate frequency is down converted to the baseband frequency. Each of these steps is performed on and through distinct elements, the first step, through mixer 1 and BPF 3, and the second step, through mixer 2 and LPF 4.

Because of the cost and complexity of downconverting the baseband portion in multiple steps in the receiver of FIG. 1, and the cost of the elements needed to perform these multiple steps, the receiver of FIG. 1 is not ideal.

Accordingly, an object of the subject invention is a receiver which overcomes the disadvantages of the prior art. Additional objects and advantages will be apparent to those of skill in the art who practice the invention or will be set forth in the disclosure which follows.

3. Related Application

This application is relation to a co-pending patent application entitled "PREPROCESSOR AND RELATED FREQUENCY TRANSLATOR," Lyon & Lyon Dkt. No. 240/111, Serial No. To Be Assigned, which is owned in common by the assignee hereof, and is being filed on even date herewith. This application is hereby fully incorporated by reference herein as though set forth in full.

BRIEF DESCRIPTION OF THE DRAWINGS

FIGS. 10(a)–(b) illustrate operation in the frequency domain of a mixer configured in accordance with the subject invention.

FIGS. 13(a)–13(c) are waveforms illustrating operation of the implementation example of FIG. 6.

SUMMARY OF THE INVENTION

Figure 1:
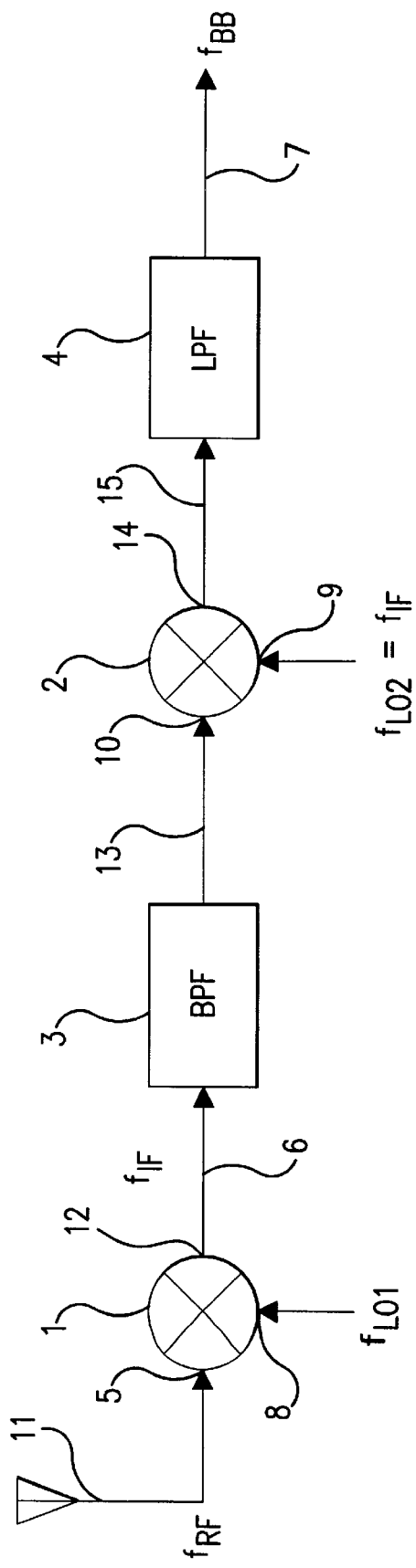
FIG. 1 illustrates a receiver of the type in which the baseband signal is downconverted to baseband frequencies in two steps.

In accordance with the purpose of the invention as broadly described herein, there is provided a direct conversion receiver system including a multiplier having first and second input ports, wherein the system is configured to reduce the effects of leakage between the first and second input ports thereof such that the receiver system is capable of use in applications requiring a high degree of isolation between the first and second input ports, such as mobile wireless handsets.

A first aspect of the subject invention comprises a direct conversion receiver system which includes a multiplier, an oscillator circuit, and a first filter. The multiplier has a first input port configured to receive a first signal at a first frequency, a second input port configured to receive a second signal at a second frequency, and an output port. In one implementation, the first signal is an RF signal which is a baseband signal modulated onto a carrier signal. In this example, it should be appreciated that the first signal is not, strictly speaking, at a single frequency. The first filter is coupled to the output of the multiplier. It is configured to allow passage of the baseband component of the signal output from the multiplier, but to substantially reject at least one higher frequency component.

The first input port is coupled to a second filter configured to allow passage of the first frequency but substantially reject passage of the second frequency. The second input port is coupled to a third filter, but this filter is configured to allow passage of the second frequency and substantially reject passage of the first frequency. Preferably, these filters are inside or inherent to the multiplier circuit so that the multiplier does not have exposed unfiltered ports. The multiplier is configured to provide an output signal derived from the product of the filtered first and second signals.

The oscillator circuit is configured to generate the second signal at a second frequency which is related to the first frequency such that the first frequency is at least approximately an integral multiple of the second frequency. In other words, the second frequency is at least approximately a subharmonic of the first frequency. This relationship can be expressed by the following mathematical relationship in which n is an integer: $f_1 \cong nf_2$. The output of the multiplier has a baseband component, as well as other components at other higher frequencies. This baseband component is isolated from the other higher frequency components through the first filter, and provided as an output of the receiver system.

A second aspect of the subject invention comprises a multiplier which performs a switching action at a rate which is n times the second frequency, where n is the integer referred to previously in relation to describing the relationship between $f_1$ and $f_2$. The switching occurs at a rate which defines the transfer function between a first input and the output of the multiplier. Consequently, the output signal is representative of the product of the switching rate and the first signal. By providing a switching action at a rate which is n times the second frequency, energy in the output signal is conserved in the sense that more energy is packed by the multiplier into the baseband component of the output signal than if the switching action were performed at the rate of the second frequency. More specifically, by switching at n times the second frequency, the energy of the incoming signal is, at a first order level, split between the desired baseband component, and a higher frequency component. Had switching occurred at the rate of the second frequency, the energy of the incoming signal would have been split, at a first order level, between components at the first frequency plus or minus $\frac{1}{n}$ times the second frequency, and only higher order (and much lower amplitude) components would have appeared at baseband frequencies.

It is contemplated that the subject invention comprises the foregoing first and second aspects singly or in combination. Also provided are related methods and computer readable media.

The foregoing direct conversion receiver system reduces the effects of leakage between the first and second input ports of the multiplier. In the case in which there is leakage from the second input port to the first input port, the leakage, which is at the frequency $f_2 \cong \frac{1}{n}f_1$, will be substantially rejected by the filter integrated with the first port, which, as discussed, is configured to substantially reject the frequency $f_2$. In the case in which there is leakage from the first port to the second port, the leakage, which is at the frequency $f_1 \cong nf_2$, will be substantially rejected by the filter integrated with the second port, which is configured to substantially reject the frequency $f_1 \cong nf_2$. In both cases, the leakage will be prevented from mixing with the signal from which it originated, and will thus be precluded from generating a distortion to the baseband component of the output signal.

In the case of leakage from the second port out through the antenna, this will typically be rejected by a bandpass filter with a passband centered around the first frequency which is normally provided upstream of the multiplier, and between the multiplier and the antenna. Such a filter is normally included to select the receive band for the system. If this filter is configured to substantially reject the second frequency, it will incidentally perform the benefit of blocking leakage from the second input port, and preventing it from radiating out through the antenna. If this filter is not configured to substantially reject the second frequency, then another filter configured to substantially reject the second frequency but allow passage of the first frequency should be added upstream from the multiplier and between the antenna and multiplier.

Another advantage of the foregoing receiver system, compared to a system in which the LO frequency is at the RF carrier frequency, is a less complex, less sensitive, and less power-consuming oscillator circuit, stemming from the fact that the frequency of the output of the oscillator circuit in the foregoing system is less than that of the oscillator circuit set at the RF carrier frequency.

Additional advantages of the foregoing receiver system in relation to the receiver of FIG. 1 include the elimination of a mixer, mixer 2, and also a filter, BPF 3, which is typically referred to as the IF filter. The elimination of the IF filter is particularly advantageous since it typically must be implemented off-chip. Since the remaining filters in the system can typically be implemented on-chip, the result is a more compact system.

In one implementation, the multiplier is a mixer having an RF input port, and a LO input port. The oscillator circuit is a local oscillator circuit having an output coupled to the LO input of the mixer. The RF input of the mixer receives a signal comprising a baseband signal modulated onto an RF carrier, that is, a carrier at RF frequencies. The frequency of the signal output from the local oscillator circuit is ½ the frequency of the RF carrier. (Consequently, a receiver incorporating such a mixer is referred to as a direct conversion receiver which utilizes half-frequency injection.) The mixer in this implementation is configured to provide a switching action at a rate equal to twice the LO frequency. A low pass filter is coupled to the output port of the mixer. The output of the mixer includes a baseband component representative of the baseband signal, and a higher frequency component, that is, a component at about twice the RF frequency. The lowpass filter substantially isolates the baseband component from the high frequency component, and outputs a signal representative of the baseband component. The lowpass filter also rejects any unwanted signals outside the desired band around $f_{BB}$.

DETAILED DESCRIPTION OF THE PREFERRED EMBODIMENTS

1. Preliminary Discussion re: Direct Conversion Receivers

Figure 2:
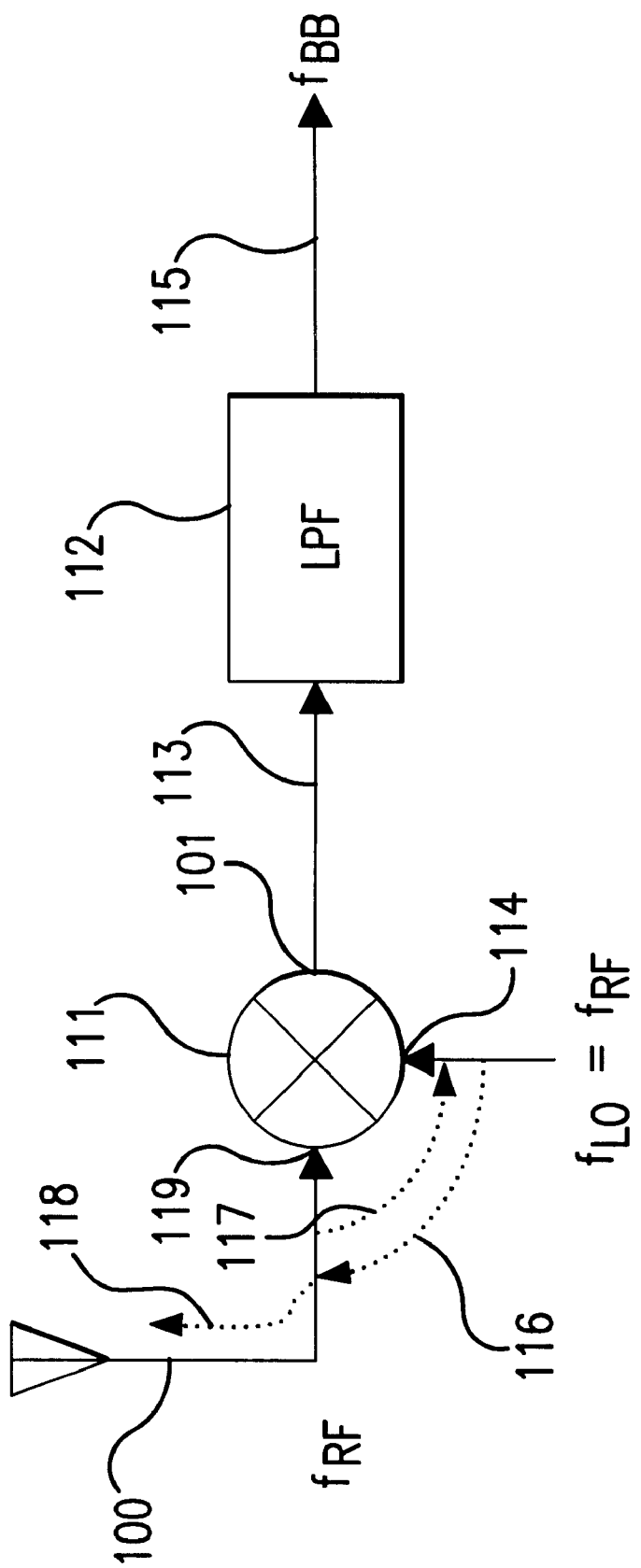
FIG. 2 illustrates a direct conversion receiver subject to the effects of leakage between the RF and LO ports.

A direct conversion receiver, that is, a receiver in which the baseband portion of the incoming RF signal is down-converted to baseband frequencies in a single step, is illustrated in FIG. 2. As illustrated, the receiver of FIG. 2 comprises an antenna 100 coupled to the RF input port 119 of mixer 111. Mixer 111 has a LO input port 114, and an output port 101. The mixer mixes the signals provided at the RF and LO input ports, and provides the mixed signal to the output port. In the receiver of FIG. 2, the frequency of the signal provided at the LO input port, $f_{LO}$, is matched to the frequency of the signal provided at the RF input port, $f_{RF}$, such that $f_{LO} \cong f_{RF}$. The mixed signal provided at the output port 101 of mixer 111 has a first order component at the baseband frequency, $f_{BB}$, and a first component at twice the LO or RF frequencies, or $2f_{LO}$.

The output port 101 of mixer 114 is coupled to LPF 112 through signal line 113. The purpose of LPF 112 is to isolate the baseband component of the signal output from mixer 111 from the higher frequency component at the frequency $2f_{LO}$. LPF 112 also rejects any unwanted signals outside the desired band around $f_{BB}$. The output of the LPF 112 is provided on signal line 115. It represents the baseband portion of the RF signal received over antenna 100.

Comparing the receivers of FIGS. 1 and 2, it can be seen that an advantage of the design of FIG. 2 is the elimination of a mixer, a filter (BPF 3), and the associated cost of these components. However, a problem with this design is its vulnerability to leakage between the signals on the RF and IF input ports of the mixer. This problem is explained further in the following section.

With reference to FIG. 2, consider the case in which a portion of the signal provided at the LO input port leaks onto the RF input port. Such is identified with reference numeral 116 in FIG. 2. This portion will be mixed by mixer 111 with the original LO signal, thus producing a distortion in the output signal at the baseband frequency. Since this distortion is at the baseband frequency, it will pass through LPF 112, and appear in the output signal provided on signal line 115. The result is that this output signal is distorted in relation to the baseband portion of the incoming signal received over antenna 100.

Consider next the case in which a portion of the signal provided at the RF input port leaks onto the LO input port. Such is represented by identifying numeral 117 in FIG. 2. This portion will be mixed by mixer 111 with the original RF signal, thus producing a distortion in the output of the mixer at the baseband frequency. Again, this distortion, being at the baseband frequency, will appear in the output signal provided on signal line 115.

In addition to leakage between the RF and LO input ports, another problem stems from the LO signal leaking onto and being radiated by antenna 100. This leakage is represented by identifying numeral 118 in FIG. 2. This leakage can interfere with other similar receivers that may be present in the same geographical area since the radiated LO component is at the same frequency as the RF signals received by these other receivers.

This leakage problem renders the direct conversion receiver of FIG. 2 unsuitable for use in applications such as GSM mobile wireless handsets, and other systems with large blocker suppression requirements, because the distortion introduced by the leakage is unacceptable for these applications.

Efforts to solve this problem have involved shielding and physical separation between the RF and LO inputs. Shielding, however, is ineffective at the high frequencies which typically characterize current mobile wireless phones, 900 MHz or more. Moreover, physical separation is impractical for use in integrated circuits, in which space is at a premium.

The distortion introduced by leakage always results in unwanted DC at the mixer output. For GSM and some other systems, this DC is not allowed to be removed by mechanisms such as a blocking capacitor because the desired signal may itself contain DC.

2. Reducing the Effects of Leakage

Figure 3:
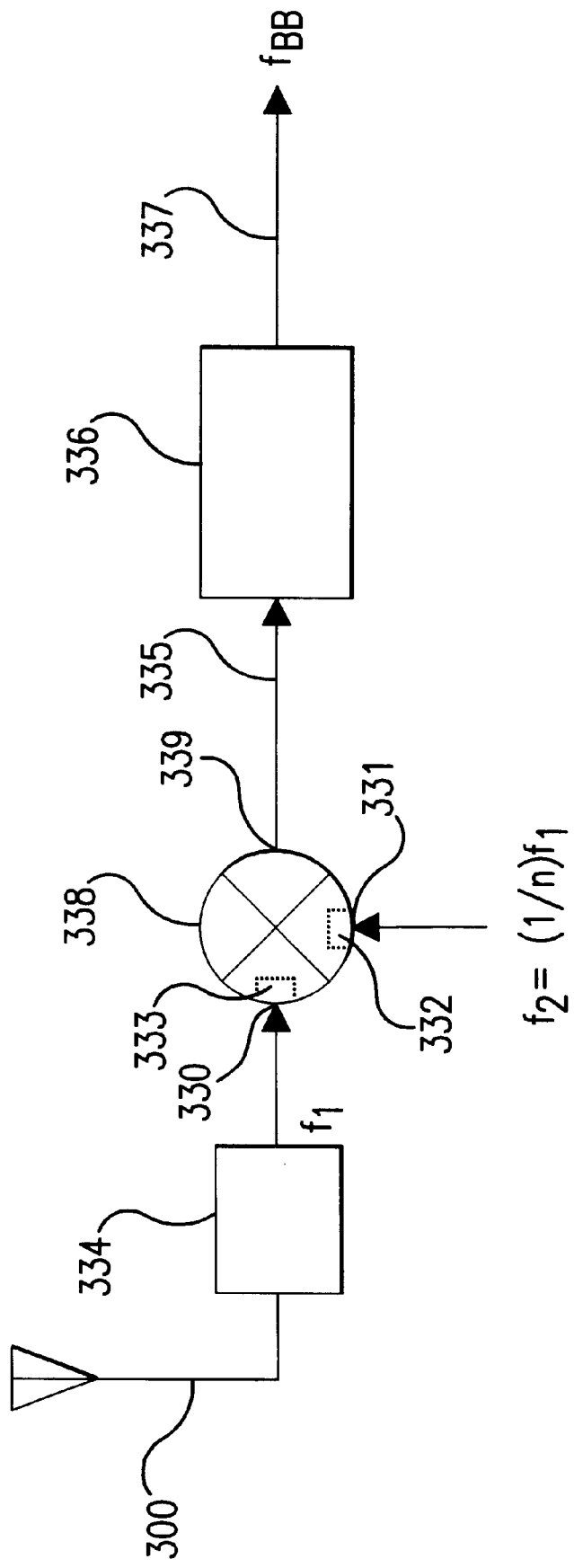
FIG. 3 illustrates a direct conversion receiver configured in accordance with an embodiment of the subject invention.

The subject invention comprises a direct conversion receiver configured to reduce the effects of leakage. A first embodiment of a direct conversion receiver system in accordance with the subject invention is illustrated in FIG. 3. As shown, the system comprises antenna 300 coupled to processing circuitry 334. The antenna is configured to receive a first signal at a first frequency. In one implementation, the first signal is a baseband signal modulated onto an RF carrier. The processing circuitry 334 is configured to perform certain standard processing operations on the incoming signal, including bandlimiting the incoming signal so that it is within a predetermined frequency range, which is typically the full system receive band consisting of all receive channels. In one implementation, the processing circuitry includes a bandpass filter to perform this bandlimiting task. These processing steps are known to those of skill in the art, and need not be explained further.

Also included in the first embodiment of the receiver system is a multiplier 338 having a first input port 330, a second input port 331, and an output port 339. The first input port 330 is configured to receive the output of the processing circuitry 334 at the frequency $f_1$. In one implementation, the multiplier is a mixer, and the first input port is a RF input port. The second input port is configured to receive a second signal at a second frequency $f_2$ from an oscillator circuit (not shown). In one implementation, the second input port is a LO input port, the oscillator circuit is a local oscillator circuit, and the second signal is a LO signal generated by the local oscillator circuit.

The oscillator circuit is configured to generate the second signal at the second frequency $f_2$ which bears a relationship with the first frequency $f_1$. More specifically, according to this relationship, the first frequency $f_1$ is about an integral multiple of the second frequency $f_2$ such that $f_1 \cong nf_1$ wherein n is an integer. In one implementation, n is 2, such that the second frequency is about ½ of the first frequency, although it is exactly ½ the frequency of the RF carrier. In one implementation example, the second frequency is the LO frequency, the first frequency is the RF frequency, and n is 2 such that the LO frequency is about ½ of the RF frequency. This implementation example utilizes what is known as half-frequency injection.

Also included in the system are filters 333 and 332. As shown, filter 333 is coupled to the first input port 330 of multiplier 338, and filter 332 is coupled to the second input port 331 of multiplier 338. These filters are inside or inherent to the multiplier/mixer circuit, so that the multiplier/mixer does not have exposed unfiltered ports. The purpose of these filters is to reduce the effects of leakage between the first and second input ports 330 and 332. The filter 333 is configured to substantially filter out the frequency $f_2$, while filter 332 is configured to substantially filter out the frequency $f_1$. In one implementation, filter 333 is a high pass filter and filter 332 is a low pass filter. In one implementation example, filter 333 is integral with input port 333 and filter 332 is integral with input port 331.

Multiplier 338 is configured to multiply the first and second signals respectively appearing at the first and second input ports 330 and 331, after filtering by filters 333 and 332 respectively, and to provide the multiplied signal to output port 339.

Multiplier 338 is configured to multiply the first and second signals with a switching action which is n times the rate of frequency $f_2$ such that the baseband component at the output of the multiplier is a first order component of the output. Filter 336 is configured to isolate the baseband component at the output of the multiplier from other, high-frequency components. This aspect of multiplier 338 can be explained further with reference to FIGS. 10(a)–(b). With reference to FIG. 10(a), this figure illustrates the operation in the frequency domain of a conventional multiplier in which the frequency of the LO input thereof is ½ that of the RF carrier, and the switching action in the multiplier is maintained at the LO frequency. The incoming RF signal, identified with numeral 900, is split into two first order output components, each having ½ the energy of the incoming RF signal. The first component, identified with numeral 901, is centered at a frequency equal to the LO frequency, or ½ the RF frequency. The second component, identified with numeral 902, is centered at a frequency equal to three times the LO frequency, or 3/2 the RF carrier frequency. This can be seen from the following $(A \cos 2 \pi f_{RF} t) \times (B \cos 2 \pi f_{LO} t) = \frac{1}{2} AB [\cos 2 \pi (f_{RF} - f_{LO}) t] + \frac{1}{2} AB [\cos 2 \pi (f_{RF} + f_{LO}) t]$. The first of the foregoing components is at the frequency ½ $f_{RF}$ or $f_{LO}$, while the second of the foregoing components is at the frequency 3/2 $f_{RF}$ or 3 $f_{LO}$. As can be seen, there are no first order components at baseband frequencies.

With reference to FIG. 10(b), this figure illustrates the operation in the frequency domain of a multiplier configured to provide a switching action at a rate equal to twice the LO frequency in accordance with one embodiment of the subject invention. The incoming RF signal, which is identified with numeral 903, is split into two first order output components, identified with numerals 904 and 905. The first component, identified with numeral 904, is centered at baseband frequencies, and the second component, identified with numeral 905, is centered at twice the RF frequency, or $2f_{RF}$. As can be seen, a first order component at baseband frequencies is provided in the multiplier of FIG. 10(b), but not in the multiplier of FIG. 10(a).

Figure 4A:
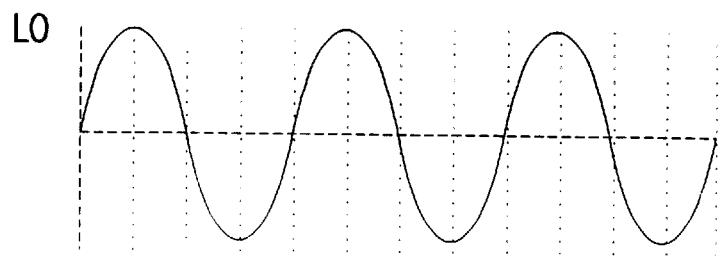
FIGS. 4(a)–4(d) are waveforms illustrating operation of the mixer of FIG. 5.
Figure 4B:
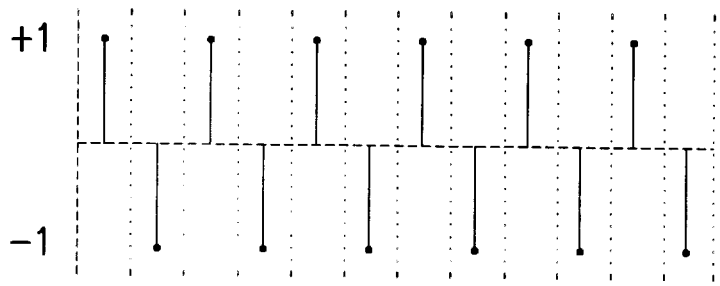
Figure 4C:
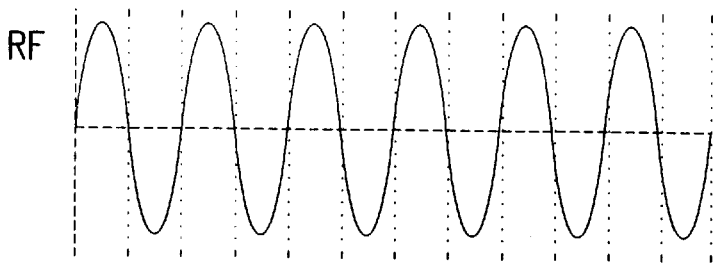

The operation in the time domain of a multiplier configured in accordance with one embodiment of the subject invention can be explained further with reference to FIGS. 4(a)–(d). FIG. 4(a) is an example of a LO signal applied to the second input of the multiplier, and FIG. 4(c) is an example of a RF signal applied to the first input of the multiplier. As can be seen, the frequency of the LO signal is ½ that of the RF signal.

Figure 4D:
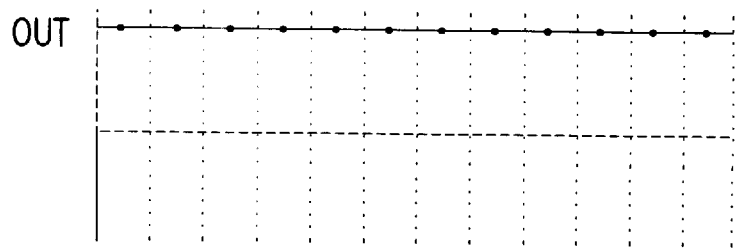

FIG. 4(b) is a multiplication factor which defines the transfer function between the incoming RF signal of FIG. 4(c) and the output signal, illustrated in FIG. 4(d). As can be seen, the frequency of the switching action of the multiplication factor is twice that of the LO frequency. The product of the multiplication factor and the RF signal defines the output signal of FIG. 4(d).

Figure 5:
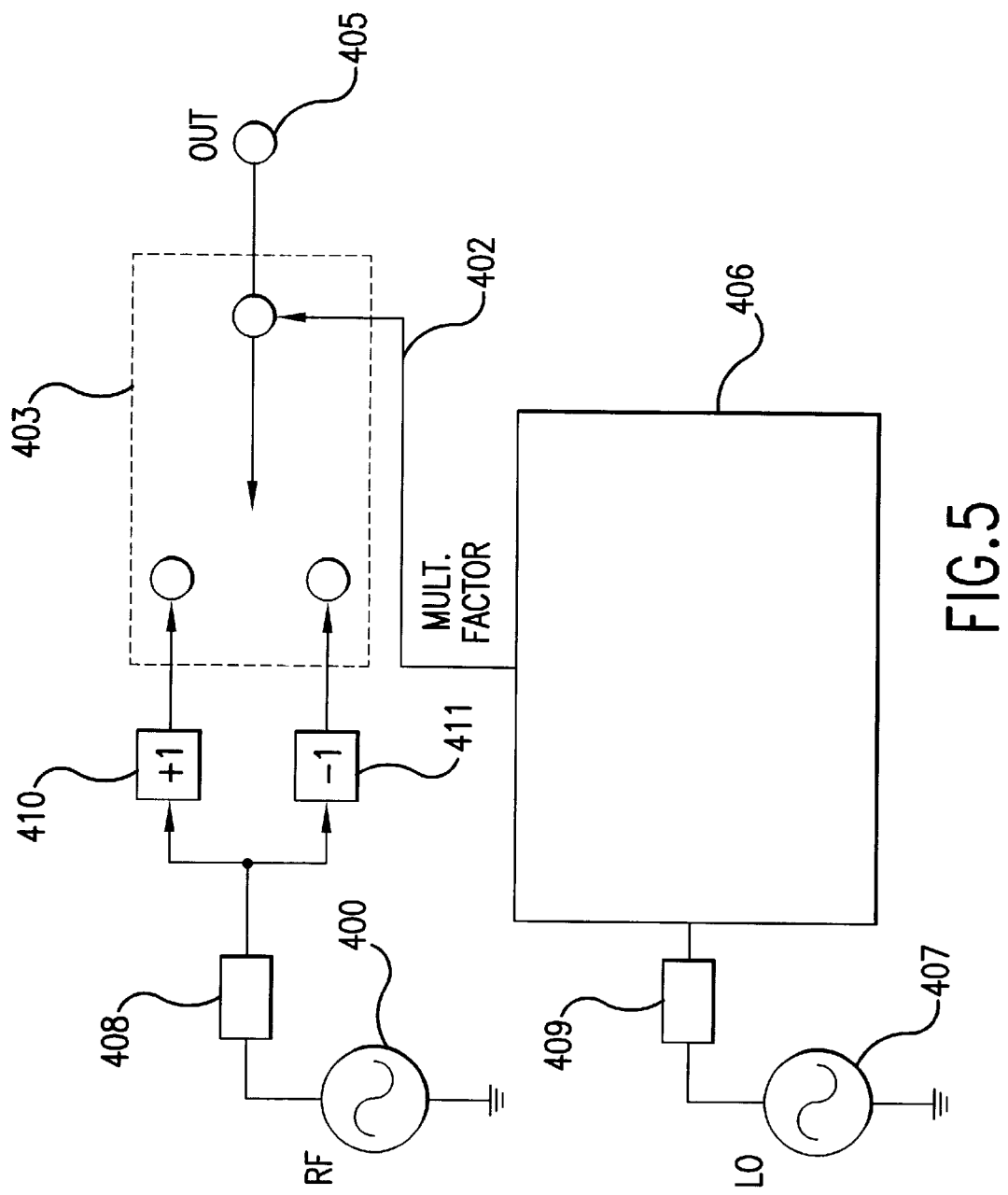
FIG. 5 is a block diagram of an exemplary embodiment of a mixer configured in accordance with the subject invention.

FIG. 5 illustrates a block diagram of one embodiment of a multiplier in accordance with the subject invention. In this embodiment, LO source 407 is coupled to low-pass filter (LPF) 409, and RF source 400 is coupled to high-pass filter (HPF) 408. The output of LPF 409 is input to circuit block 406, which controls DTSP switch 403 through signal line 402 in accordance with a multiplication factor which, in one implementation, switches between +1 and −1 at a rate which is twice the LO frequency.

The output of HPF 408 is coupled to +1 multiplication block 410 and −1 multiplication block 411. Switch 403 is configured such that, when the multiplication factor is at +1, the output of multiplication block 410 is provided to the output 405, and when the multiplication factor is −1, the output of −1 multiplication block 411 is provided to the output 405. Consequently, a signal is produced at output 405 which is representative of the product of the multiplication factor and the filtered RF signal output from HPF 408.

It is important that the multiplication factor is not actually produced as a signal at a pin or node of the multiplier. As one of skill in the art would appreciate, it would be counterproductive to actually produce such a signal on a pin or node of the multiplier since the objective of this embodiment is to provide an LO signal which is about ½ the RF frequency, and production of a signal at a pin or node at twice the LO frequency would defeat that objective. Instead, in this embodiment, the multiplication factor simply represents (1) a switching action which occurs at twice the LO frequency; and (2) the transfer function between the incoming filtered RF signal and the output signal.

Figure 11:
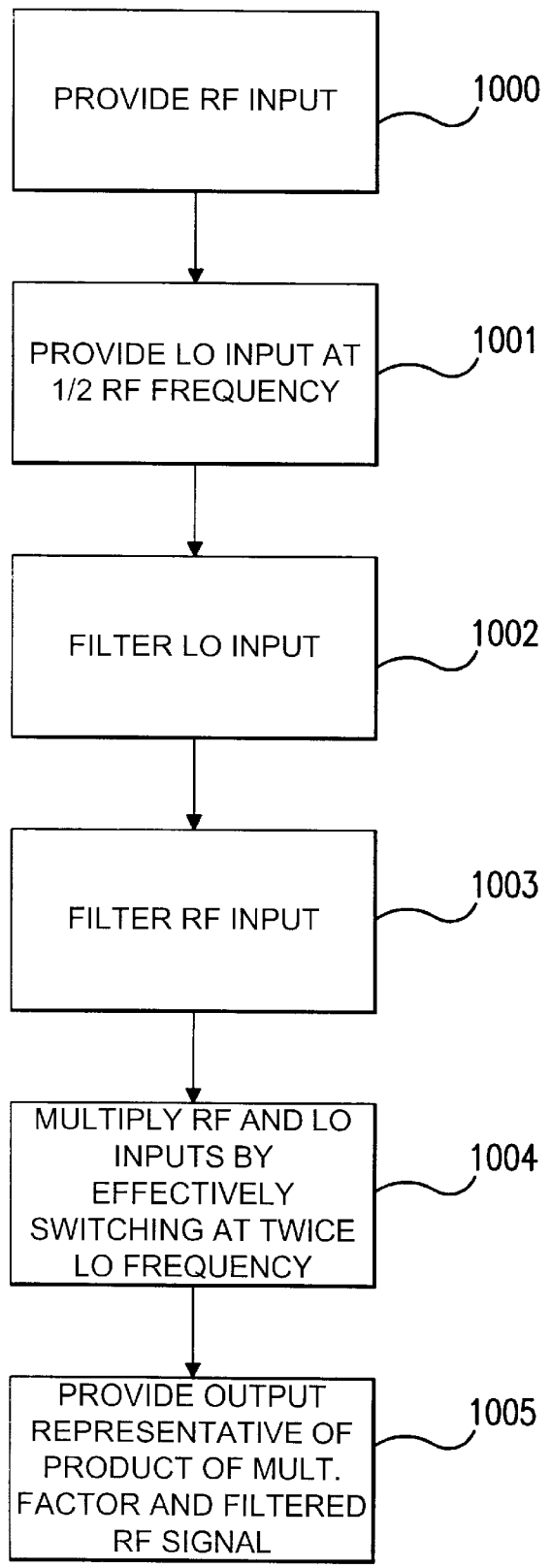
FIG. 11 illustrates a first embodiment of a method of operation of the subject invention.

A method of operation of this embodiment of the multiplier is illustrated in FIG. 11. As illustrated, in step 1000, an RF input is provided, and in step 1001, an LO input is provided at a frequency which is about ½ of the RF frequency. In step 1002, the LO signal is filtered to substantially filter out any components at the RF frequency. In step 1003, the RF signal is filtered to substantially filter out any components at the LO frequency. In step 1004, the filtered RF and LO inputs are multiplied while a switching action is effectively performed at twice the LO frequency. In step 1005, an output signal is determined which is representative of the product of a multiplication factor which switches at twice the LO frequency and the filtered RF signal.

As discussed previously, the multiplication factor does not represent an actual signal determined by the multiplier of the subject invention. Instead, it represents the effective switching action which occurs within the multiplier and also represents the transfer function between the incoming RF signal and the output signal.

Figure 12:
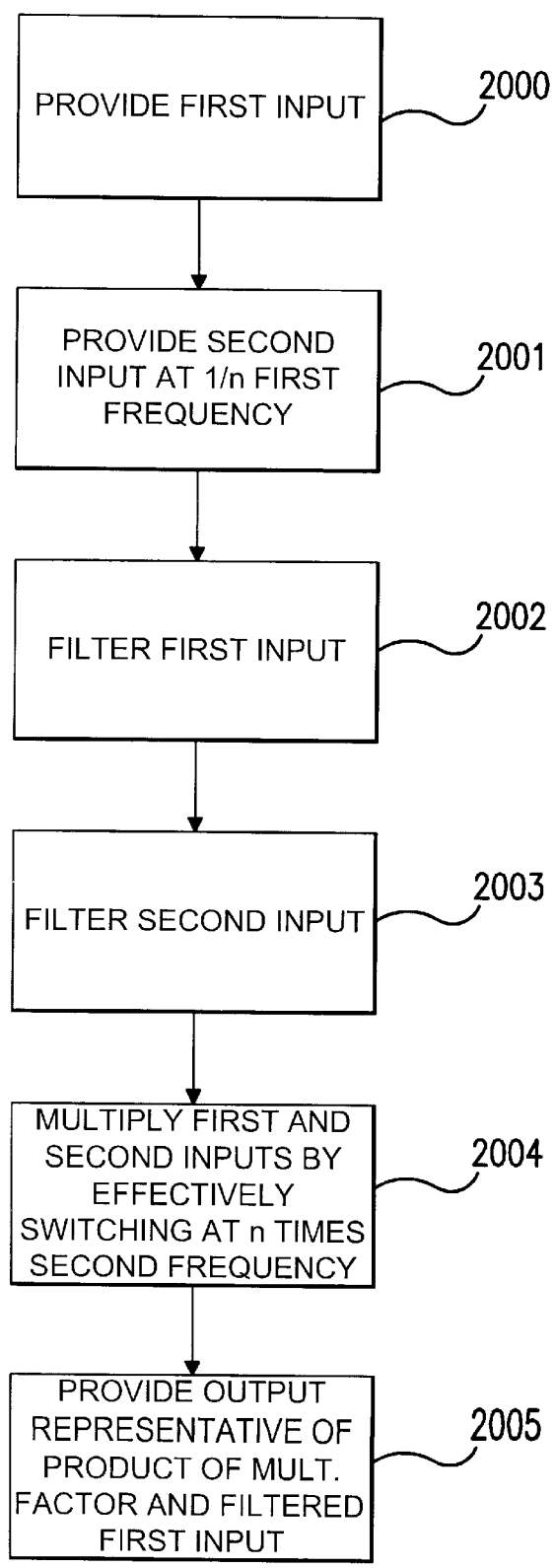
FIG. 12 illustrates a second embodiment of a method of operation of the subject invention.

A method of operation of the embodiment of the subject invention of FIG. 3 is illustrated in FIG. 12. As indicated, in step 2000, a first input signal is provided at a first frequency, and in step 2001, a second input signal is provided at a second frequency which is about 1/n times the frequency of the first input signal, where n is an integer. In step 2002, the first input signal is filtered to substantially filter out any components at the second frequency, and in step 2003, the second input signal is filtered to substantially filter out any components at the first frequency.

In step 2004, the filtered first and second signals are multiplied together while a switching action is performed at n times the second frequency. In step 2005, an output is determined which is representative of the product of a multiplication factor which switches at about n times the second frequency and the filtered first signal.

Compared to the direct conversion receiver of FIG. 2, the foregoing direct conversion receiver system is less vulnerable to leakage between the first and second input ports of the multiplier. In the case in which there is leakage from the second input port to the first input port, the leakage, which is at the frequency $f_2 \cong \frac{1}{n} f_1$, will be substantially rejected by the filter coupled to the first port, which, as discussed, is configured to substantially reject the frequency $f_2$. In the case in which there is leakage from the first port to the second port, the leakage, which is at the frequency $f_1 \cong nf_2$, will be substantially rejected by the filter coupled to the second port, which is configured to reject the frequency $f_1 \cong nf_2$. In both cases, the leakage will be substantially prevented from mixing with the signal from which it originated, and will thus be substantially precluded from generating a distortion to the baseband component of the output signal.

In the case of leakage from the second port out through the antenna, this will typically be rejected by a bandpass filter with a passband approximately centered around the first frequency which is normally provided upstream of the multiplier (such as block 334 in FIG. 3). Such a filter is normally included to select the receive band for the system. If this filter is configured to substantially reject the second frequency, it will incidentally perform the benefit of blocking leakage from the second input port, and preventing it from radiating out through the antenna. If this filter is not configured to substantially reject the second frequency, then another filter configured to substantially reject the second frequency but allow passage of the first frequency should be added upstream from the multiplier and between the antenna and multiplier.

Another advantage of the foregoing receiver system in relation to the direct conversion receiver of FIG. 2 is a less complex oscillator circuit, stemming from the fact that the frequency of the output of the oscillator circuit in the foregoing system is less than that of the oscillator circuit implied in the design of FIG. 2.

Additional advantages of the foregoing receiver system in relation to the receiver of FIG. 1 include the elimination of a mixer, mixer 2, and also a filter, BPF 3, which is typically referred to as the IF filter. The elimination of the IF filter is particularly advantageous since it typically must be implemented off-chip. Since the remaining filters in the system can typically be implemented on-chip, the result is a more compact system.

In light of the foregoing, it can be seen that a direct conversion receiver system is provided in which the effects of leakage between the first and second input ports of the multiplier thereof are reduced. The result is a direct conversion receiver which is suitable for use in GSM/DCS mobile handsets, in which there is a requirement that the leakage between the RF and LO inputs of the mixer thereof be reduced about 80–90 dB.

It should be appreciated that embodiments are possible in which the multiplier thereof provides an effective switching action at the second frequency provided the multiplier outputs a significant higher order baseband component. For example, in the case in which half frequency injection is utilized, that is, the LO frequency to the mixer is about ½ the RF frequency, and the mixer switches at the LO frequency, the baseband component will be a second order component rather than a first order component. If this component is substantial, a receiver system employing this mixer is a possible embodiment of the invention.

Several implementation examples of the subject invention will now be described.

IMPLEMENTATION EXAMPLES

EXAMPLE NO. 1

Figure 6:
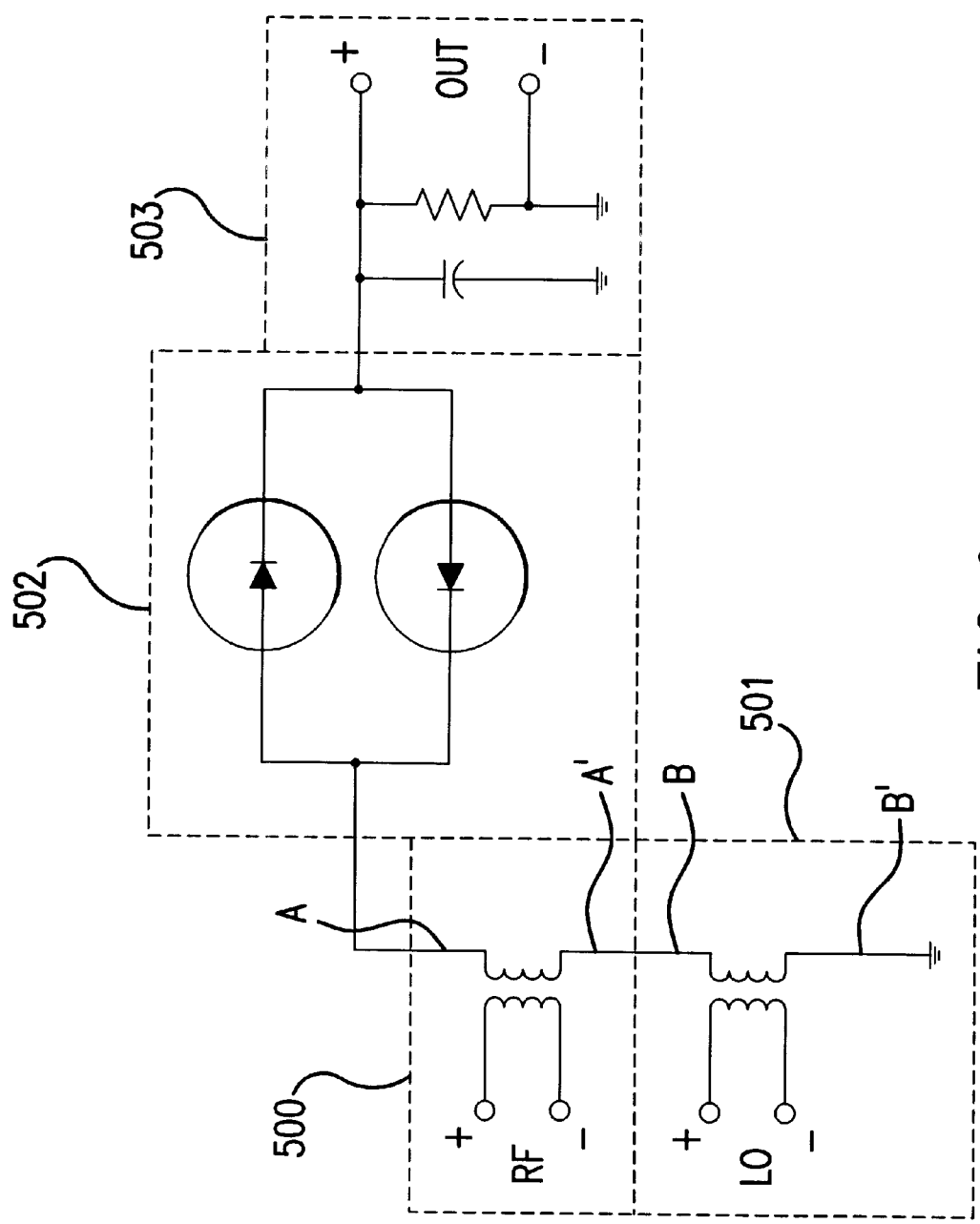
FIG. 6 illustrates a first implementation example of a mixer configured in accordance with the subject invention.

A first implementation example of a mixer utilizing half-frequency injection in accordance with one embodiment of the subject invention is illustrated in FIG. 6. The mixer in this example comprises RF input block 500, LO input block 501, diode block 502, and output block 503. As shown, the RF and LO input blocks are coupled through a series connection to diode block 502, which comprises two diodes coupled back-to-back. The output of the diode block is then coupled to output block 503 which, in this example, includes a low pass filter to low pass filter the output of the diode block. In this example, since the LO frequency is about ½ of the RF frequency, a switching action is provided at twice the LO frequency by the diode block 502. FIGS. 13(*a*)–13(*c*) illustrate simulated waveforms for this implementation example. FIG. 13(*a*) illustrates the LO signal provided as an input to block 501; FIG. 13(*b*) illustrates the RF signal provided as an input to block 500; and FIG. 13(*c*) illustrates the output signal provided as an output from block 503. As can be seen, the output signal has a component at the LO frequency, and a low frequency component. The low frequency component is the desired signal. In an actual implementation, the low pass filter in output block 503 would be configured to filter out the LO frequency component.

EXAMPLE NO. 2

Figure 7:
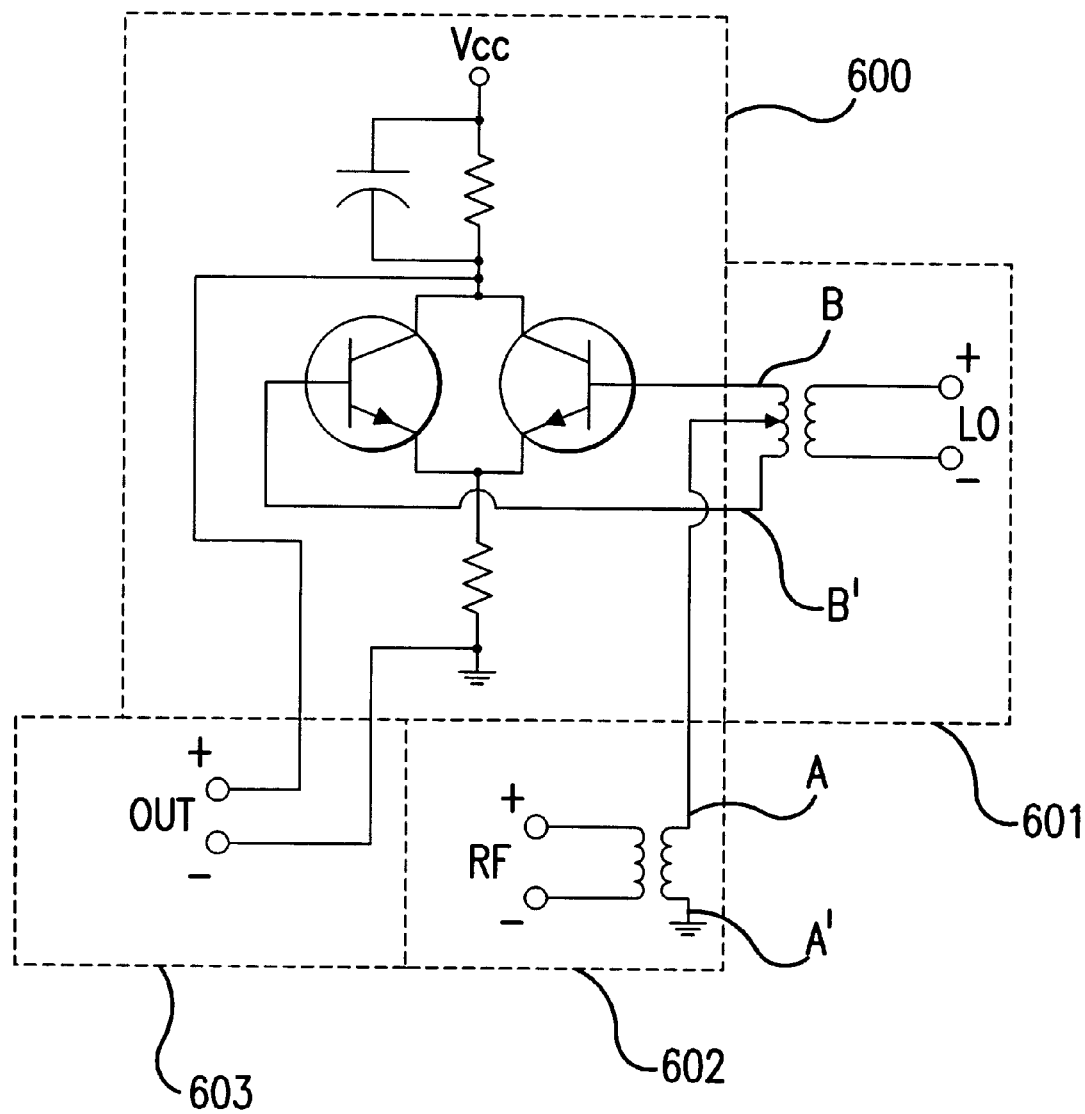
FIG. 7 illustrates a second implementation example of a mixer configured in accordance with the subject invention.

A second implementation example of a mixer utilizing half-frequency injection in accordance with one embodiment of the subject invention is illustrated in FIG. 7. As shown, the mixer in this example comprises RF input block 602, LO input block 601, cross-coupled transistor block 600, and output block 603. The RF and LO input blocks are coupled to transistor block 600 as shown. The LO frequency in this example is about ½ the RF frequency. A switching action is provided by the cross-coupled transistor block 600 at twice the LO frequency.

EXAMPLE NO. 3

Figure 8:
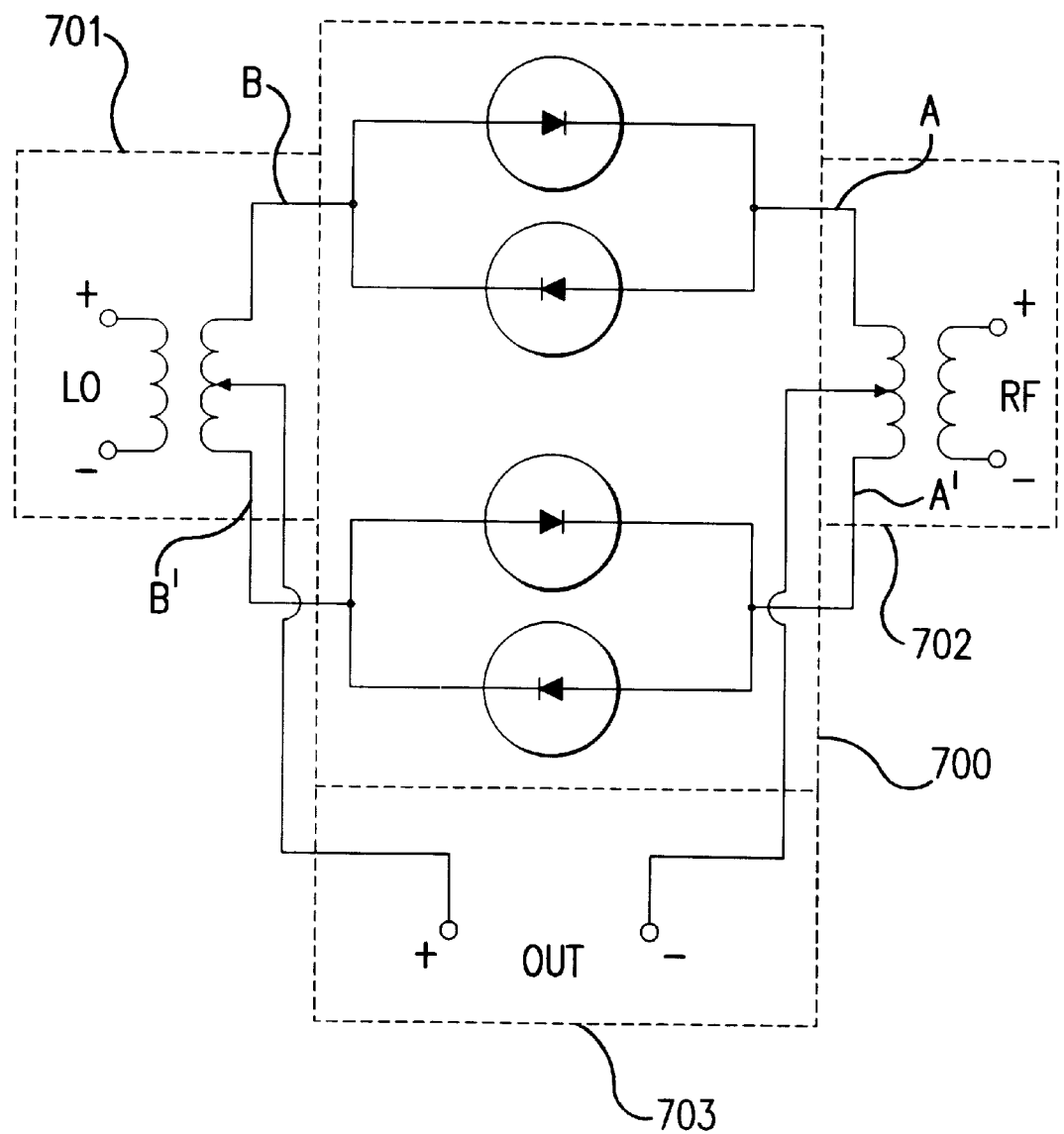
FIG. 8 illustrates a third implementation example of a mixer configured in accordance with the subject invention.

A third implementation example of a mixer utilizing half-frequency injection in accordance with one embodiment of the subject invention is illustrated in FIG. 8. As shown, the mixer in this example comprises RF input block 702, LO input block 701, diode block 700, and output block 703, coupled together as shown. The LO frequency in this example is again about ½ the RF frequency, and a switching action at twice the LO frequency is provided by diode block 700.

EXAMPLE NO. 4

Figure 9A:
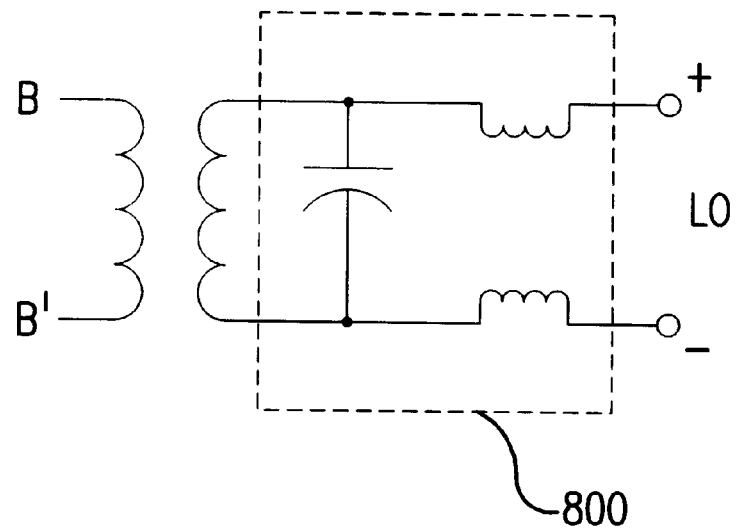
FIGS. 9(a)–9(b) illustrate implementation examples of input port filters configured in accordance with the subject invention.
Figure 9B:
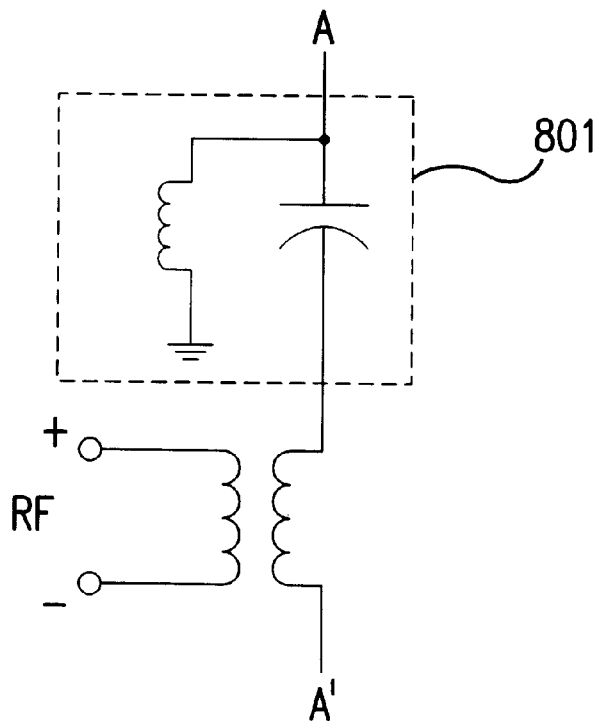

An implementation example of RF and LO input blocks incorporating filters to reduce the effects of leakage between the RF and LO inputs is illustrated in FIGS. 9(a)–(b). FIG. 9(a) illustrates an LO input block integrated with a low-pass filter configured to substantially eliminate RF frequencies. It can replace the LO input block in any of the foregoing mixer examples of FIGS. 6–8 at the line B–B' illustrated in each.

FIG. 9(b) illustrates an RF input block integrated with a high pass filter configured to substantially eliminate LO frequencies. It can replace the RF input block in any of the foregoing mixer examples of FIGS. 6–8 at the line A–A' illustrated in each.

Although this invention has been described in terms of certain preferred embodiments, other embodiments apparent to those of skill in the art are also within the scope of this invention. Accordingly the invention is not to be restricted except in light of the appended claims and their equivalents.

What is claimed is:

1. A direct conversion receiver system comprising:
   a multiplier having a first input port for receiving a first signal at a first frequency, a second input port for receiving a second signal at a second frequency equal to about $1/n$ times the first frequency, wherein n is an integer, and an output port, wherein the multiplier is configured to provide to the output port an output signal representative of the product of the first signal and a multiplication factor which is switched at n times the second frequency, the output signal having a baseband component and another component;
   an oscillator circuit for providing to the second input port the second signal at the second frequency about equal to $1/n$ times the first frequency, wherein n is an integer;
   a first filter inside or inherent to the multiplier, coupled to the first input port and configured to substantially filter out leakage at the second frequency;
   a second filter inside or inherent to the multiplier, coupled to the second input port and configured to substantially filter out leakage at the first frequency; and
   a third filter coupled to the output port of the multiplier and configured to substantially filter out the other component, and maintain the baseband component in the output signal.

2. The system of claim 1 wherein n is 2.

3. The system of claim 1 wherein the first signal is an RF signal.

4. The system of claim 1 wherein the second signal is a LO signal.

5. The system of claim 1 wherein the multiplier is a mixer.

6. The system of claim 1 wherein the first filter is integral with the first input port.

7. The system of claim 1 wherein the second filter is integral with the second input port.

8. The system of claim 1 wherein the first filter is a high pass filter.

9. The system of claim 1 wherein the second filter is a low pass filter.

10. The system of claim 1 wherein the third filter is a low pass filter.

11. A direct conversion receiver system comprising:
    a multiplier having a first input port for receiving a first signal at a first frequency, a second input port for receiving a second signal at a second frequency about equal to $1/n$ times the first frequency, wherein n is an integer, and an output port, wherein the multiplier is configured to provide to the output port an output signal derived from the product of the filtered first and second signals, the output signal having a baseband component and another component;
    an oscillator circuit for providing to the second input port the second signal at the second frequency about equal to $1/n$ times the first frequency, wherein n is an integer;
    a first filter inside or inherent to the multiplier, coupled to the first input port and configured to substantially filter out leakage at the second frequency;
    a second filter inside or inherent to the multiplier, coupled to the second input port and configured to substantially filter out leakage at the first frequency; and
    a third filter coupled to the output port of the multiplier and configured to substantially filter out the higher frequency component, and maintain the baseband component in the output signal.

12. A method for performing direct conversion of a first signal comprising:
    providing to a first input port of a multiplier a first signal at a first frequency;
    providing to a second input port of the multiplier a second signal at a second frequency about equal to $1/n$ times the first frequency, wherein n is an integer;
    filtering, using a first filter inside or inherent to the multiplier, the first signal to substantially filter out any leakage at the second frequency which may be present;
    filtering, using a second filter inside or inherent to the multiplier, the second signal to substantially filter out any leakage at the first frequency which may be present;
    providing an output signal representative of the product of the filtered first signal and a multiplication factor which switches at n times the second frequency, the output signal having a baseband component and a higher frequency component; and
    filtering the output signal to substantially remove the higher frequency component and maintain the baseband component in the output signal.

13. The method of claim 12 wherein the first signal is an RF signal.

14. The method of claim 12 wherein the second signal is an LO signal.

15. The method of claim 12 wherein n is 2.

16. A computer readable media embodying a series of instructions to perform a method for performing direct conversion of a first signal comprising the following steps:
    providing to a first input port of a multiplier a first signal at a first frequency;
    providing to a second input port of the multiplier a second signal at a second frequency about equal to $1/n$ times the first frequency, wherein n is an integer;
    filtering, using a first filter inside or inherent to the multiplier, the first signal to substantially filter out any leakage at the second frequency which may be present;
    filtering, using a second filter inside or inherent to the multiplier, the second signal to substantially filter out any leakage at the first frequency which may be present;
    providing an output signal representative of the product of the filtered first signal and a multiplication factor which switches at n times the second frequency, the output signal having a baseband component and another component; and
    filtering the output signal to substantially remove the other component and maintain the baseband component in the output signal.

17. A direct conversion receiver system comprising:

first means for receiving at a first input port a first signal at a first frequency, receiving at a second input port a second signal at a second frequency about equal to $1/n$ times the first frequency, wherein n is an integer, and providing an output signal derived from the product of the filtered first and second signals, the output signal having a baseband component and another component;

second means for providing to the second input port the second signal at the second frequency about equal to $1/n$ times the first frequency, wherein n is an integer;

third means inside or inherent to the first means, coupled to the first input port and configured to substantially filter out leakage at the second frequency;

fourth means inside or inherent to the first means, coupled to the second input port and configured to substantially filter out leakage at the first frequency; and fifth means coupled to the output port and configured to substantially filter out the other component, and maintain the baseband component in the output signal.

18. A method for performing direct conversion of a first signal comprising:

providing to a first input port of a multiplier a first signal at a first frequency;

providing to a second input port of the multiplier a second signal at a second frequency about equal to $1/n$ times the first frequency, wherein n is an integer;

filtering, using a first filter inside or inherent to the multiplier, the first signal to substantially filter out any leakage at the second frequency which may be present;

filtering, using a second filter inside or inherent to the multiplier, the second signal to substantially filter out any leakage at the first frequency which may be present;

providing an output signal derived from the product of the filtered first and second signals, the output signal having a baseband component and another component; and filtering the output signal to substantially remove the other component and maintain the baseband component in the output signal.

19. A direct conversion receiver system comprising:

an oscillator system for providing a first signal at a first frequency which is about an nth order subharmonic of a second frequency, wherein n is an integer greater than 1;

a frequency translator having a first input for receiving the first signal, a second input for receiving a second signal having the second frequency, and an output derived from a frequency translation of the second signal;

a first filter inside or inherent to the frequency translator, coupled to the first input and configured to substantially filter out signals at the second frequency; and a second filter inside or inherent to the frequency translator, coupled to the second input and configured to substantially filter out signals at the first frequency.

20. The system of claim 19 wherein the frequency translator is configured to switch the second signal to the output through a switching action which occurs at a frequency which is n times the first frequency.

21. The system of claim 19 wherein n is 2.

22. The system of claim 19 wherein the second signal is an RF signal.

23. The system of claim 19 wherein the first signal is a LO signal.

24. The system of claim 19 wherein the frequency translator is a multiplier.

25. The system of claim 19 wherein the frequency translator is a mixer.

26. The system of claim 19 wherein the first filter is integral with the first input.

27. The system of claim 19 wherein the second filter is integral with the second input.

28. The system of claim 19 wherein the first filter is a low pass filter.

29. The system of claim 19 wherein the second filter is a high pass filter.

30. The system of claim 19 wherein the frequency translator is configured to provide to the output an output signal having a baseband component and another component.

31. The system of claim 30 further comprising a third filter coupled to the output, and configured to substantially filter out the other component.

32. The system of claim 31 wherein the third filter is a low pass filter.

33. A method for performing direct conversion of a signal comprising:

providing to a first input of a frequency translator a first signal at a first frequency which is about an nth order subharmonic of a second frequency, wherein n is an integer greater than 1;

providing to a second input of the frequency translator a second signal having the second frequency;

providing to an output of the frequency translator a signal derived from a frequency translation of the second signal;

filtering, using a first filter inside or inherent to the frequency translator, the first signal to substantially filter out any signals at the second frequency which may be present at the first input; and filtering, using a second filter inside or inherent to the frequency translator, the second signal to substantially filter out any signals at the first frequency which may be present at the second input.

34. The method of claim 33 further comprising switching the second signal to an output at n times the first frequency.

35. The method of claim 33 further comprising providing at the output an output signal having a baseband component and another component.

36. The method of claim 35 further comprising filtering the output signal to substantially filter out the other component.

37. The method of claim 33 wherein the second signal is an RF signal.

38. The method of claim 33 wherein the first signal is an LO signal.

39. The method of claim 33 wherein n is 2.

40. A computer readable media tangibly embodying a series of instructions to perform the method of claim 33.

41. A method for performing direct conversion of a signal comprising:

a step for providing to a first input of a frequency translator a first signal at a first frequency which is about an nth order subharmonic of a second frequency, wherein n is an integer greater than 1;

a step for providing to a second input of the frequency translator a second signal having the second frequency;

a step for providing to an output of the frequency translator a signal derived from a frequency translation of the second signal;

a step for filtering, using a first filter inside or inherent to the frequency translator, the first signal to substantially filter out any signals at the second frequency which may be present at the first input; and a step for filtering, using a second filter inside or inherent to the frequency translator, the second signal to substantially filter out any signals at the first frequency which may be present at the second input.

* * * * *